United States Patent [19]

Koh

[11] Patent Number: 5,075,201
[45] Date of Patent: Dec. 24, 1991

[54] METHOD FOR ALIGNING HIGH DENSITY INFRARED DETECTOR ARRAYS

[75] Inventor: Wei H. Koh, Irvine, Calif.

[73] Assignee: Grumman Aerospace Corporation, Bethpage, N.Y.

[21] Appl. No.: 607,154

[22] Filed: Oct. 31, 1990

[51] Int. Cl.⁵ .............................................. G03F 9/00
[52] U.S. Cl. ..................... 430/321; 430/22; 430/944; 356/399; 356/401; 250/332
[58] Field of Search .............. 430/5, 22, 321, 396, 430/944, 945; 356/399, 401; 250/332

[56] References Cited

U.S. PATENT DOCUMENTS

| 3,603,369 | 9/1971 | Hamilton | 250/211 |
| 3,963,489 | 6/1976 | Cho | 430/22 |
| 4,179,990 | 12/1979 | Radencic | 430/22 |
| 4,551,629 | 11/1985 | Carson et al. | 250/578 |
| 4,617,160 | 10/1986 | Belanger | 264/40.1 |
| 4,883,359 | 11/1989 | Ina et al. | 430/22 |

FOREIGN PATENT DOCUMENTS

| 58-173831 | 10/1983 | Japan | 430/22 |
| 59-65431 | 4/1984 | Japan | 430/22 |

Primary Examiner—Richard L. Schilling
Assistant Examiner—Kathleen Duda
Attorney, Agent, or Firm—Stetina and Brunda

[57] ABSTRACT

A method for aligning infrared detector arrays having a high density of pixel elements to the surface of a signal processing module or the like is disclosed. The process comprises the steps of forming a plurality of indicia upon the second side of the infrared detector array, forming a corresponding plurality of reference indices upon the support surface, the indices being disposed in a predetermined position relative to the electrical connectors, attaching the second side of the infrared detector array to a transparent substrate and positioning the detector array adjacent the support surface and aligning the indicia to the reference indices by observing the indicia formed upon the second side of the array by looking through the transparent substrate. Three embodiments of indicia are disclosed. A through hole indicia passes from the first surface of the infrared detector array to the second surface thereof, a plurality of fiducial indicia can be formed upon the second surface of the infrared detector array, or notches can be formed in the edges of the infrared detector array and/or substrate.

11 Claims, 5 Drawing Sheets

METHOD FOR ALIGNING HIGH DENSITY INFRARED DETECTOR ARRAYS

FIELD OF THE INVENTION

The present invention relates generally to infrared detector arrays and more particularly to a method for aligning infrared detector arrays having a high density of pixel elements to the surface of a signal processing module or the like.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. Infrared wavelengths extend from 0.75 micrometers to 1 millimeter. The function of an infrared detector is to respond to energy of a wavelength within some particular portion of the infrared region.

Heated objects will dissipate thermal energy having characteristic wavelengths within the infrared spectrum Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range corresponding to the particular detection function of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared energy in one of several ways. Thermal detectors respond to infrared energy by absorbing that energy and thus causing an increase in temperature of the detecting material. The increased temperature in turn causes some other property of the material, such as resistively, to change. By measuring this change the infrared radiation can be derived.

Photo-type detectors (e.g., photoconductive and photovoltaic detectors), absorb the infrared frequency energy directly into the electronic structure of the material, inducing an electronic transition which leads to a change in the electrical conductivity (photoconductors) or to the generation of an output voltage across the terminals of the detector (photovoltaic detectors). The precise change that is affected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, advances in semiconductor materials and the development of highly sensitive electronic circuitry have advanced the performance of contemporary infrared detectors close to the ideal photon limit.

Current infrared detection systems incorporate arrays of large numbers of discrete, highly sensitive detector elements, the outputs of which are connected to sophisticated processing circuitry. By rapidly analyzing the pattern and sequence of detector element excitation, the processing circuitry can identify and monitor sources of infrared radiation.

Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on the side with 0.0005 inches spacing between detectors. Such a subarray would therefore be 1.024 inches on a side. Thus, interconnection of such a subarray to processing circuitry requires a connective module with sufficient circuitry to connect each of the 65,536 detectors to processing circuitry within a square, a little more than one inch on a side. The subarray may, in turn, be joined to form an on-focal plane array that connects to 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a signal processing module that performs at least a portion of the processing functions within the module, i.e. on integrated circuit chips disposed adjacent the detector focal plane, the signal from each detector need be transmitted only a short distance before processing. As a consequence of such on focal plane or up front signal processing, reductions in size, power and cost of the main processor may be achieved. Moreover, up front signal processing helps alleviate performance, reliability and economic problems associated with the construction of millions of closely spaced conductors connecting each detector element to the main signal processing network.

Infrared detectors are typically fabricated from monolithic semiconductor wafers by photolithographic techniques. The processed wafers are diced to form smaller arrays having various pixel sizes, such as 32×32 or 8×128. A plurality of diced arrays are attached to the signal processing modules. Many signal processing modules can be assembled to form a focal plane array.

Backside-illuminated detectors are well known. Backside-illuminated detectors have an electrical contact fabricated upon the front side, thus necessitating illumination through the substrate. The focal plane array may be formed by attaching the diced arrays to signal processing modules by flip-chip bump bonding.

In flip-chip bump bonding, the electrical contacts formed upon the front surface of the array are comprised of a soft, malleable conductive material such as indium. The indium bump bonds are electrically connected to corresponding contacts formed upon the signal processing module by flipping or inverting the infrared detector array such that the indium bump bonds contact the corresponding electrical contacts of the signal processing module. An epoxy filler may be used to secure the infrared detector arrays upon the signal processing module.

Because of the brittle nature of the infrared detector array, a thin substrate material, such as cadmium telluride (CdTe) or sapphire is typically attached to the back side of the infrared detector array prior to flip-chip bump bonding. The substrate provides mechanical support to the array and thereby facilitates handling.

A particular problem with the attachment of detector arrays to surfaces such as the contacts of the signal processing module is alignment. The back side or illuminated surface of the CdTe or sapphire substrate is polished to provide a smooth surface. The smooth surface is required to provide maximum absorption and transmission of incident infrared radiation to the detector elements. Therefore, no features exist upon the back surface of the substrate to indicate the exact positions of the detector element pixels of the infrared detector array beneath.

In the prior art, the detector pixel locations are determined by measuring the distance between the pixels and the array edges of the front side. However, once an array is positioned for attachment to a signal processing module, only the back side is visible. Therefore, the edges of the back side must be used as an indirect reference. That is, since the front side edges of the infrared detector array to which the initial measurement was made are not visible, the back side edges must be used instead. The rear edges of the diced array may not be true to the front edges, e.g. due to tapers or chips in the substrate, therefore the accuracy of using the back edges as references is quite limited.

The most accurate dicing equipment today has an average tolerance of ±5 microns. In combining the errors due to imperfections on the edges with the accuracy of dicing, an overall accuracy of using the back side edges to locate the pixel is estimated to be approximately ±10 microns.

It is also necessary to know the precise locations of the pixel elements of infrared detector arrays after they have been attached to signal processing modules. This is required when the signal processing modules are being assembled into a staring focal plane array. The pixels must be aligned when the signal processing modules are formed into a focal plane array. Precise placement of the detector pixels is necessary to achieve the intended performance.

Placement of the pixels must be identifiable from the back side of the arrays both before and after they are attached to the signal processing electronics in order to obtain the required performance. Therefore, it would be desirable to provide a means for obtaining the precise locations of the pixel elements formed upon the front side of the detector array by visually observing the back side of the array.

SUMMARY OF THE INVENTION

The present invention specifically addresses and alleviates the above-mentioned deficiencies associated in the prior art. More particularly, the present invention comprises a method for aligning infrared detector arrays having a high density of pixel elements formed upon its first surface to the surface of a signal processing module or the like. The process comprises the steps of forming a plurality of indicia upon the second side of the infrared detector array, forming a corresponding plurality of reference indices upon the support surface, the indices being disposed in predetermined positions relative to the electrical connectors, attaching the second side of the infrared detector array to a transparent substrate, positioning the detector array adjacent the support surface and aligning the indicia to the reference indices by observing the indicia formed upon the second side of the array by looking through the transparent substrate.

Three embodiments of indicia are disclosed. A through hole indicia passes from the first surface of the infrared detector array to the second surface thereof, a plurality of fiducial indicia can be formed upon the second surface of the infrared detector array, or notches can be formed in the edges of the infrared detector array and/or substrate.

In the first embodiment of the invention through holes are formed in the infrared detector array by a process such as etching or laser drilling. Thus, the apertures extend through the detector array from the first side to the second side thereof. The locations where the apertures are to be formed may be defined by providing corresponding indicia on a detector pixel implant mask such that the locations are marked with a high precision, on the first side of the array during the pixel implant process. An etchant specific to the detector material may be used such that the attached substrate is not etched.

In a second embodiment of the present invention indicia may be etched upon the second side of the infrared detector array. The method for forming the indicia upon the second side of the infrared detector array comprises the steps of placing the detector array in a double sided mask aligner, aligning a mask for the second side of the detector array to a primary reference located on the first side of the detector array, the mask having indicia formed thereon, and exposing and developing the second side of the detector array to form the indicia upon the array.

In a third embodiment of the present invention a plurality of notches are formed along at least one edge portion of the detector array. The notches extend substantially from the first side to the second side of the detector array, and may also extend across the substrate. The notches may be formed by disposing the detector array in a precision laser microprocessing machine and forming the notches with a laser. A laser beam having a diameter of approximately 10 microns or less is preferred.

DETAILED DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

The method of aligning high density infrared detector arrays of the present invention is illustrated in FIGS. 1-12 which depict three presently preferred embodiments of the invention.

Figure 1:
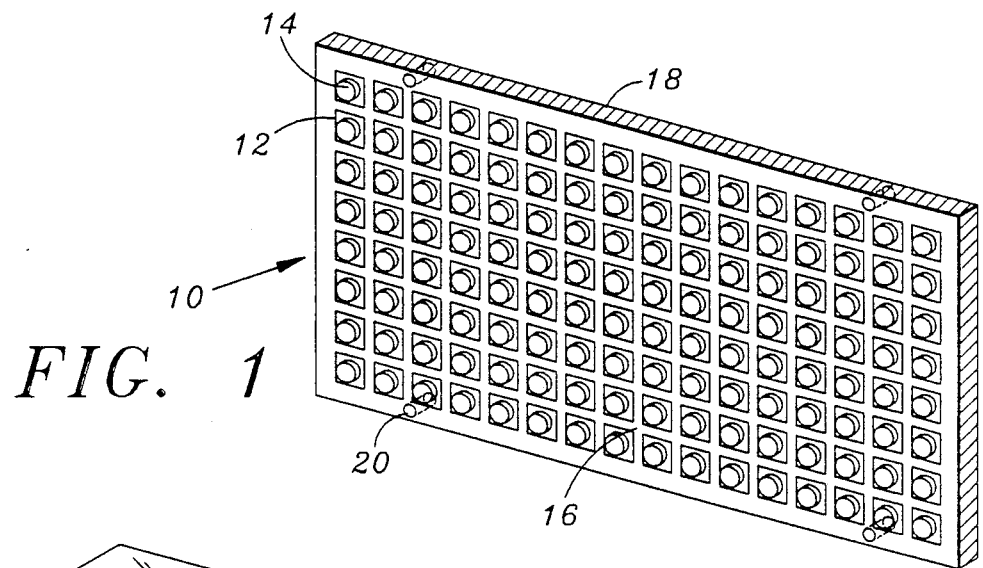
FIG. 1 is a perspective view of the front side of an infrared detector array according to a first embodiment of the present invention showing the individual detector elements or pixels and also showing four through-hole fiducial.

Referring now to FIG. 1, an infrared detector array 10 has an 8×16 array of individual detector elements or pixels 12 formed upon the front surface 16 thereof. Each detector element or pixel 12 has an electrical contact or bump 14 formed thereupon. Four through-hole fiducial 20 are formed in the infrared detector array 10. Each through-hole fiducial 20 passes from the front or first 16 surface of the array 10 to the back or second 18 surface thereof. Thus, each through-hole fiducial 20 is visible upon the back surface 18 of the array 10.

Figure 2:
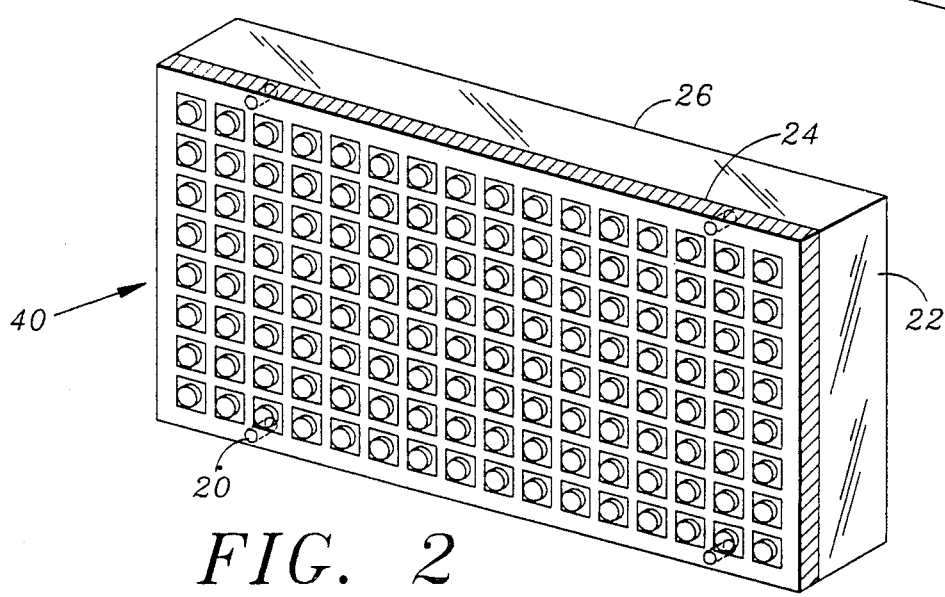
FIG. 2 is a perspective view of the front of the infrared detector array of FIG. 1 having a support substrate attached to the back side thereof.

Referring now to FIG. 2, a support substrate 22 is attached in laminar juxtaposition to the back side 18 of the infrared detector array 10. Infrared detector arrays are commonly comprised of a very thin and extremely brittle material such as mercury cadmium telluride, HgCdTe. To facilitate handling of the delicate infrared detector array 10 a support substrate 22 comprised of an infrared transparent material such as CdTe or an optical and infrared transparent material such as sapphire is attached thereto. The thickness of the support substrate is typically on the order of several hundred microns, thus providing substantial mechanical support to the infrared detector array and providing a means of handling the delicate array 10.

The back side 26 of the support substrate 22 is polished to provide a very smooth surface. This is to facilitate the absorption and transmission of infrared radiation from the back side of the substrate 22 to the infrared detector elements 12. The smooth surface is required to reduce reflection and scattering of incident infrared radiation. Thus, no features exist upon the support substrate surface which can be used to indicate the positions of the infrared detector elements 12 attached thereto.

The four through-hole fiducial 20 of the present invention therefore provide a means for visibly observing an indication of the positions of the infrared detector elements or pixels 12 from the back side 26 of the support substrate 22. That is, the fiducial 20 are observed by looking through the substrate 22. This is possible because the support substrate 22 is transparent to visible and/or infrared radiation. Thus, the fiducial 20 may be observed using a standard optical microscope or an infrared camera. The fiducial 20 may therefore be used in the alignment of the infrared detector array 10 to indices formed upon a signal processing module or the like.

Figure 3:
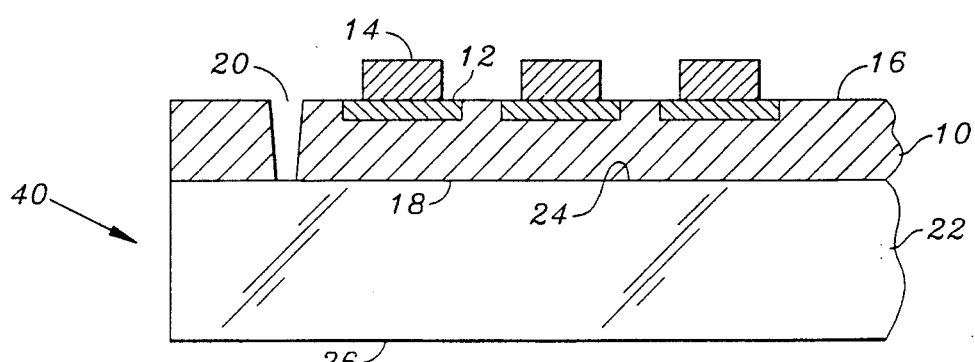
FIG. 3 is a cross-sectional side view of a portion of the detector array of FIG. 2 showing a single through-hole fiducial and three detector element pixels.

Referring now to FIG. 3, a cross-sectional side view of the infrared detector array 10 and support substrate 22 is depicted. Each fiducial through-hole 20 extends from the front surface 16 of the infrared detector array 10 to the back surface 18 thereof. Thus, the through-hole fiducial 20 are visible from the back side 26 of the transparent support substrate 22.

Figure 4:
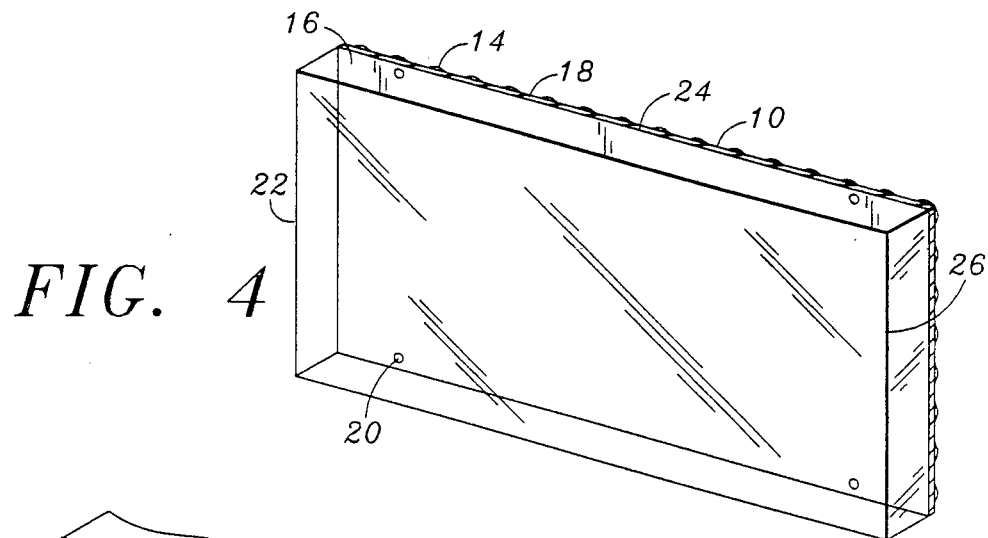
FIG. 4 is a perspective view of the back side of the support substrate of FIGS. 2 and 3 depicting the four through-hole fiducial of the infrared detector array visible therethrough.

Referring now to FIG. 4, the through-hole fiducial 20 are depicted as viewed through the transparent support substrate 22. Thus, a means is provided for visually aligning the infrared detector elements 12 to a planar surface such as a signal processing module. Alignment is performed with respect to the through-hole fiducial 20 by visually observing the through-hole fiducial 20 with a standard optical microscope or infrared camera.

The positions of the through-hole fiducial 20 relative to the individual detector elements or pixels 12 can be controlled with an accuracy of approximately 1 micron on the first side and a 2 micron on the second side. Thus, the through-hole fiducial 20 gives an accurate indication of the location of the individual detector elements 12. This permits the detector array 10 to be aligned relative to the surface by observing the locations of the through-hole fiducial 20 since the positions of the pixels 12 relative to the fiducial 20 are known. The fiducial 20 may be aligned to a fixed reference formed upon the surface or to an optical reference within the microscope.

Additionally, the through-hole fiducial 20 allow the positioning of the pixels 12 to be verified after mounting to signal processing modules. Improperly aligned arrays 10 can either be removed and re-aligned or discarded.

The through-hole fiducial 20 also provide a means for aligning signal processing modules having infrared detector arrays 10 mounted thereon. After the infrared detector arrays 10 are mounted to signal processing modules, then the signal processing modules are assembled to form a focal plane array. This requires that the individual pixels 12 of each detector array 10 mounted upon a signal processing module be aligned to the pixels of adjacent modules. This is easily accomplished by aligning the fiducial 20 of the present invention. Alignment of signal processing modules is discussed in further detail with respect to the third embodiment of the present invention and illustrated in FIG. 12.

The through-hole fiducials 20 may be formed by either etching or laser drilling. Those skilled in the art will recognize that other methods are also suitable. To etch the through-hole fiducials, their locations are included in the detector wafer implant mask. Thus, when the detector wafer implant photoresists are formed, the features of the fiducial are incorporated. The fiducials may then be photolithographically developed during wafer fabrication. They may then be either wet or dry etched to form small, i.e. 25 micron, cavities. These cavities can be further etched to form through-hole fiducials. If etching is preferred after the support substrate 22 is attached, then an etchant specific to the detector material can be used such that the support substrate 22 is unaffected.

In the laser drilling method, the front side 16 of the array 10 is likewise etched by incorporating the location of the fiducial in the detector Wafer implant mask. The etched fiducial are then used as targets for laser drilling and through-holes are formed.

Figure 5:
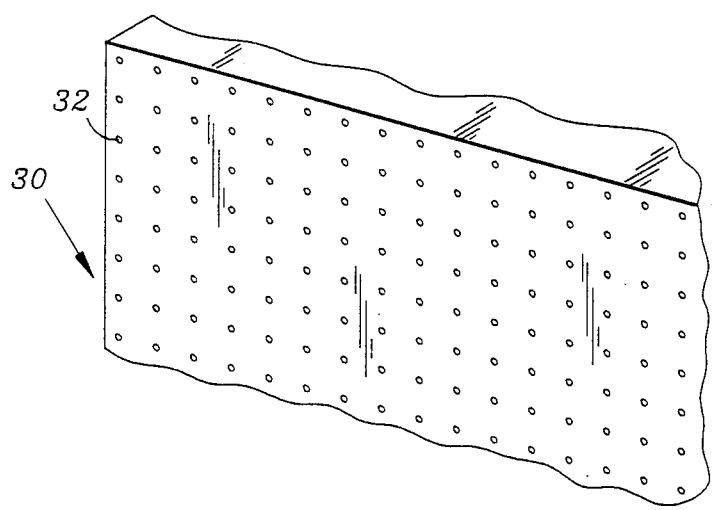
FIG. 5 is a sectional perspective view of a signal processing module showing the electrical contacts formed upon the connecting surface thereof.

Referring now to FIG. 5, a portion of a signal processing module 30 is depicted. The signal processing module 30 has a plurality of electrical contacts 32 formed upon one surface thereof. These contacts 32 are spaced on the same centers and correspond in number to the individual detector elements 12. Thus the bump contacts 14 of the detector elements 12 provide electrical connection between the infrared detector array 10 and the signal processing module 30 when attached thereto.

Figure 6:
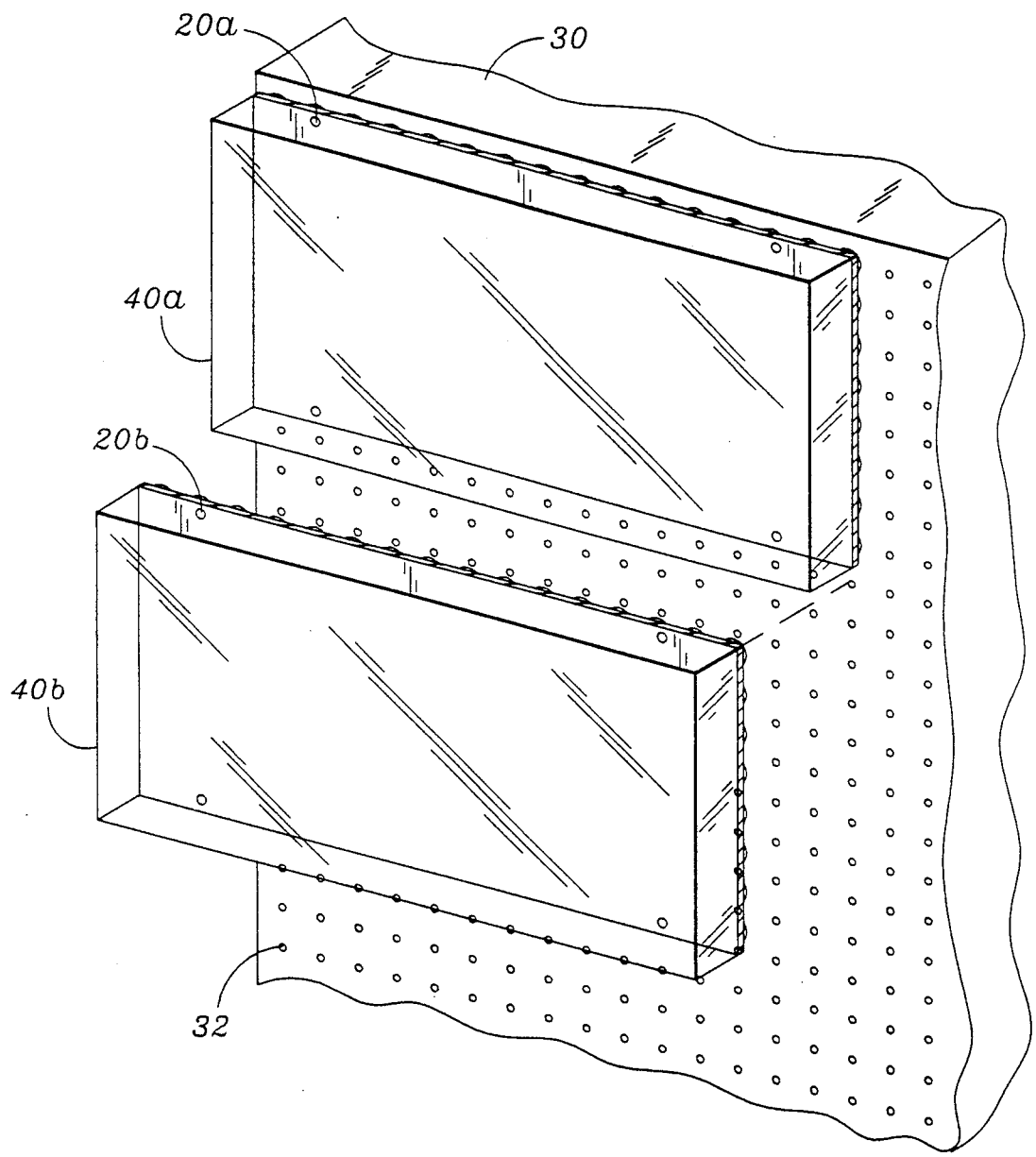
FIG. 6 is a perspective view of the signal processing module of FIG. 5 showing an infrared detector array according to the first embodiment of the present invention attached thereto and another such infrared detector array positioned to be attached thereto.

Referring now to FIG. 6, two infrared detector arrays 40a and 40b and the signal processing module 30 are depicted. Infrared detector array 40a is shown aligned and attached to signal processing module 30. Infrared detector array 40b is shown aligned and in position to be attached to signal processing module 30.

To align the first infrared detector array 40a to the signal processing module 30, the bump contacts 14 of the array 40b are aligned to the contacts 32 of the module 30. This assures proper positioning and good electrical contact. Fiducial 20a are used to visually align infrared detector array 40a to signal processing module 30. This may be accomplished by computing the position of the fiducial 20a of the infrared detector array 40a relative to the individual pixels 12 formed thereon and then aligning the fiducial 20a to reference indices representative of the positions of the contacts 32 of the signal processing module 30. This may be easily accomplished by using a crosshair reference in an optical microscope or infrared camera system. For example, the crosshair may be placed at the position where a particular fiducial is desired to be located and the infrared detector array 40a may then be positioned such that the fiducial 20a is aligned with the crosshair. This process may be repeated for each of the fiducial 20a of the infrared detector array 40a. The desired positions of the fiducial 20a may be easily calculated since the positions of the contacts 32 of the signal processing module 30 are easily measured using the crosshair of the optical alignment system and the positions of the fiducial 20a relative to the individual pixels 12 are known.

Subsequent infrared detector arrays such as 40b must be aligned to the pixels 12 of any adjacent arrays as well as being aligned to the electrical contacts 32. The fiducial 20b of the second infrared detector array 40b are similarly aligned to the fiducial 20a of the first infrared detector array 40a such that the pixels 12 of both arrays are aligned. This is easily accomplished since the positions of the fiducial 20a and 20b are known relative to the pixels 12 of each infrared detector array. Thus, the crosshair of the optical alignment system is placed in the desired location of a particular fiducial 20b of infrared detector array 40b and infrared detector 40b is manipulated into a location such that the fiducial 20b is in alignment with the crosshair. This process is again repeated for at least two fiducials. Thus, alignment among pixels 12 of all infrared detector arrays attached to a given signal processing module is obtained.

Alignment of adjacent signal processing modules 30 can likewise be achieved by aligning the fiducial of infrared detector arrays of one module to those of adjacent modules. Thus, a focal plane array can be constructed wherein all pixels are in the desired alignment.

Figure 7:
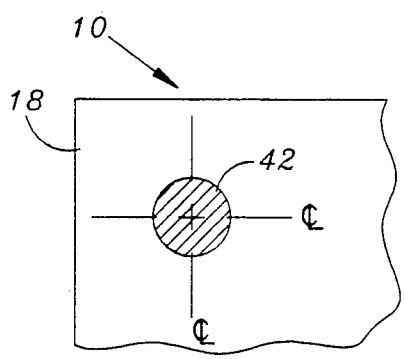
FIG. 7 is a top plan view of a circular fiducial according to a second embodiment of the present invention.
Figure 8:
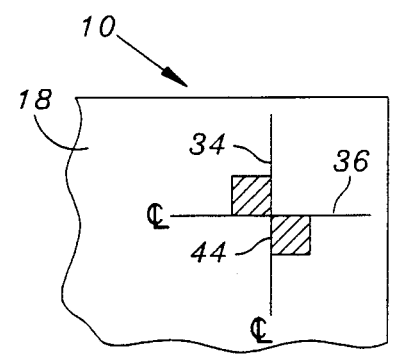
FIG. 8 is a top plan view of a double square fiducial according to a second embodiment of the present invention.

Referring now to FIGS. 7 and 8, a second preferred embodiment of the method for aligning high density infrared arrays is depicted. In the second preferred embodiment of the present invention the back side 18 of each infrared detector array 10 is etched to form indicia which may be used for alignment purposes. Those skilled in the art will recognize that various forms of indicia are suitable for alignment purposes. For example, a circle as depicted in FIG. 7 or a double square as depicted in FIG. 8 may be used.

The use of etched indicia upon the back side of infrared detector arrays 10 avoids the need to etch or drill through-holes into the array 10. The use of etched indicia formed upon the back side 18 of each infrared detector array 10 does however, require the use of a double side mask aligner and a separate mask for defining the locations of the etched indicia.

Etched indicia such as those depicted in FIGS. 7 and 8 provide observable reference points which may be used in the same manner as the through-hole fiducial described above. The fiducial or indicia 42 may be etched onto the back side of the infrared detector array 10 by placing the array in a double side mask aligner, such as the Model MA25 manufactured by Karl Suss. This is done prior to attaching the array to the support substrate and preferably prior to dicing the wafer. It can also be done after the substrate is attached so that fiducial is now on the surface of the substrate.

A second mask containing the desired fiducial features is aligned to the primary reference of the wafer located on the detector front side. This positions the mask, and consequently the fiducial to be formed, in a known position relative to the pixels 12 formed upon the front of the array 10. The back side of the wafer is then exposed and developed to lithographically imprint the fiducial features on the array back side. The wafer is then diced to form individual arrays. Thus, each individual array may have a plurality of indicia or fiducial etched thereupon.

Figure 9:
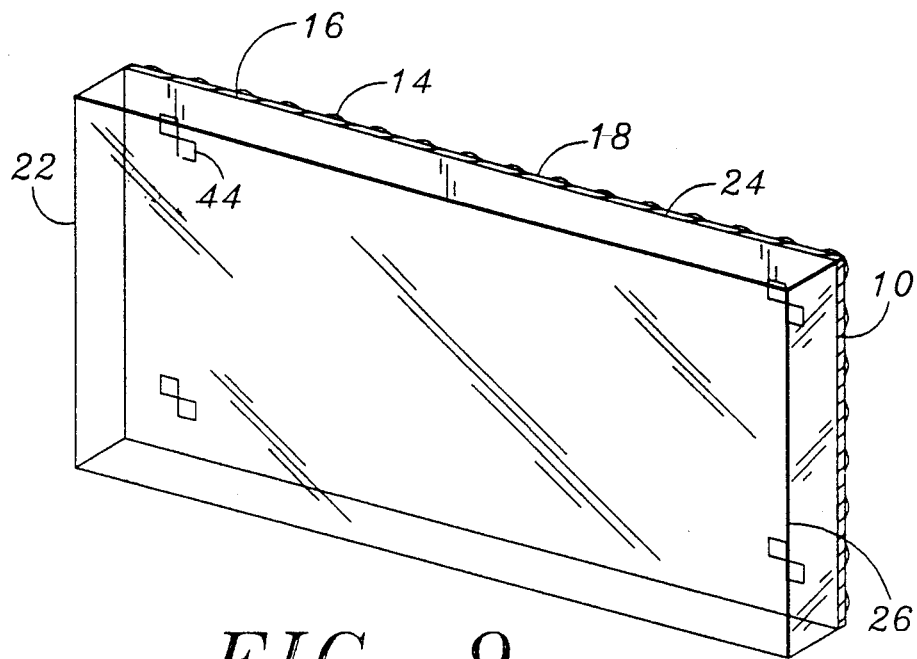
FIG. 9 is a perspective view of the back side of the support substrate depicting four double square fiducial formed upon the back side of the infrared detector array according to the second embodiment of the present invention.
Figure 10:
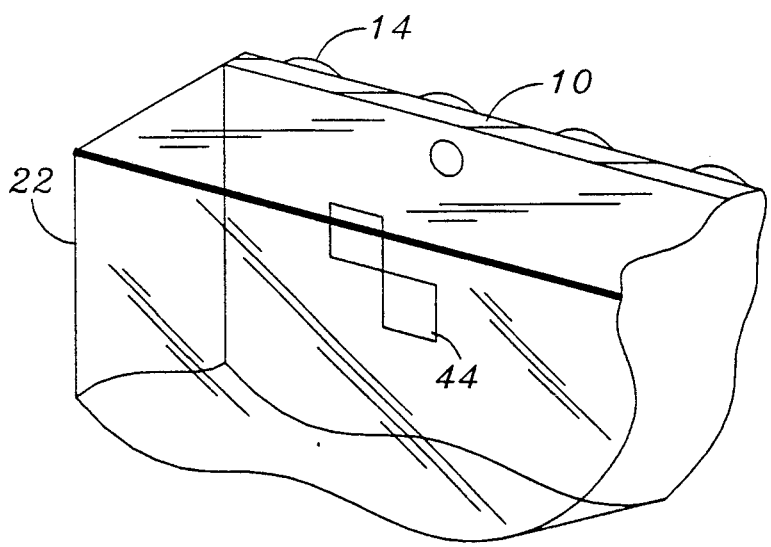
FIG. 10 is an enlarged perspective view of one double square fiducial of FIG. 9.

Referring now to FIGS. 9 and 10, double square indicia or fiducial 44 are depicted as viewed through the transparent support substrate 22. The double square indicia 44 are used in a manner similar to the through-hole indicia 20 of the first preferred embodiment of the present invention. The double square indicia 44 provide improved accuracy and ease of use over both the through-hole indicia 20 and the circle indicia of FIG. 7 in that the double square indicia 44 have straight edges which may be easily aligned with a crosshair. As shown in FIG. 8 the center lines 34 and 36 may be easily aligned to an optical crosshair whereas the center point of a circle indicia 42 of FIG. 7 or a through-hole indicia of the first embodiment require that the user visually estimate the center of the circle or hole.

Figure 11:
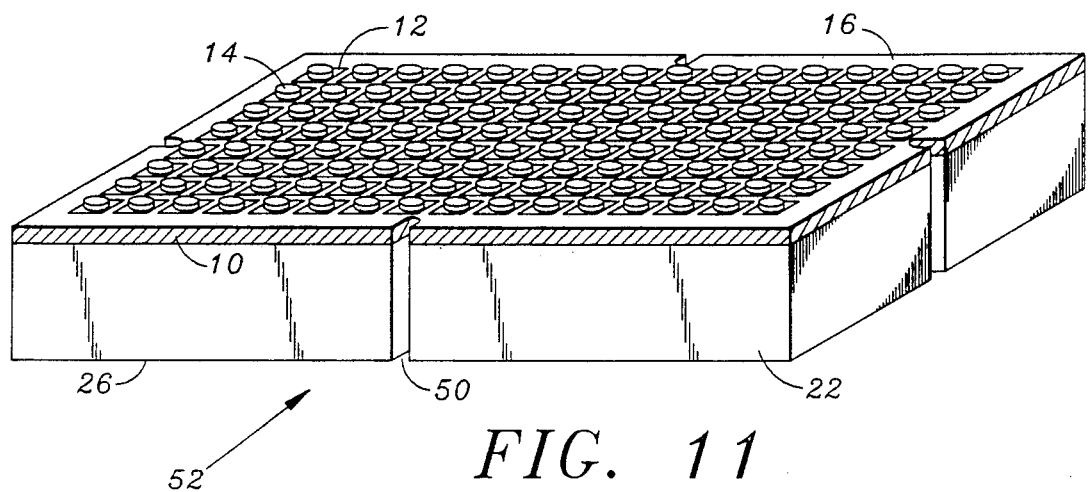
FIG. 11 is a perspective view of the top and side surfaces of an infrared detector array and support substrate having notches formed in the edges thereof according to a third embodiment of the present invention.

Referring now to FIG. 11, a third embodiment of the method for aligning high density infrared detector arrays of the present invention is depicted. Notches 50 are formed along the edges 34 of the infrared detector array 10. The notches are formed such that they are perpendicular to the upper 16 and lower 26 surfaces of the array. Thus, viewing a notch 50 from the back side 26 of the array 10 provides a true indication of the location of the notch upon the front side 16 of the array and thus provides a true indication of the pixel 12 positions. This is because the positions of the pixels 12 can be precisely measured relative to the notches 50.

This technique is suitable for both wafers and arrays that have already been diced from the wafer. The wafer or diced array is placed, front side up, in a precision laser microprocessing machine such as Model 1000 manufactured by XMR. A laser having a beam of approximately 10 microns in diameter is used to scribe a plurality of notches 50 along the edge portions of the array. If being performed upon a wafer, through-holes are formed where the wafer is to be diced such that after dicing notches 50 are formed from the through-holes.

Nothing of the edge portions of the array has the added advantage that the notches 50 may be used as references during the stacking of an assembly of mosaic focal planes wherein each array is individually attached to a thin signal processing module and the modules are subsequently stacked to form an array. In the stacking process the edge portions of the individual photodetector arrays are visible and may therefore serve as references.

Figure 12:
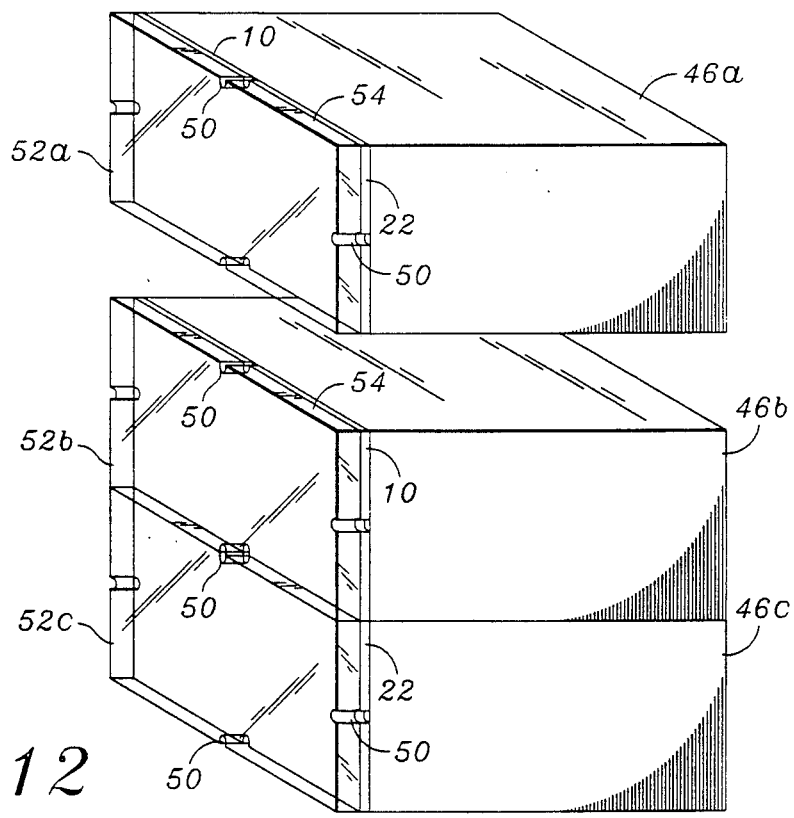
FIG. 12 is a perspective view of the front and top surfaces of three thin signal processing modules being stacked to form a mosaic focal plane array.

Referring now to FIG. 12, three thin signal processing modules 46a, 46b, and 46c are depicted as they are being stacked to form a mosaic focal plane. Modules 46b and 46c are shown in alignment and module 46a is positioned for attachment to module 46b. Infrared detector array assemblies 52a, 52b, and 52c are attached to modules 46a, 46b, and 46c prior to aligning modules 46a, 46b, and 46c. Thus, the notches 50 formed upon the assemblies 52a, 52b, and 52c may be used to align the modules 46a, 46b, and 46c such that the pixels (not shown) formed upon each infrared detector array 10 will be aligned in the assembled mosaic focal plane array. As can be seen, alignment of the notches 50 of adjacent edges of assemblies 52a, 52b, and 52c results in alignment of the individual infrared detector arrays 10. These notches 50 can be observed from various angles during the stacking process to facilitate alignment. For example, the notch formed upon the upper surface 54 of each assembly 52a, 52b, and 52c can be observed by looking down at the assembly through an optical system. A crosshair within the optical system can then be used to align successive grooves 50 to achieve the desired positioning.

It is understood that the exemplary method for aligning high density infrared detector arrays described herein and shown in the drawings represents only presently preferred embodiments of the invention. Indeed, various modifications and additions may be made to such embodiment without departing from the spirit and scope of the invention. For example, the precise shape and location of the through-hole fiducial of the first embodiment are not considered crucial to the present invention. It is only necessary that the position of the fiducial upon the first surface of the array be known relative to the pixels and that the position of the fiducial upon the second surface of the array be true to that upon the first surface. Also, various shapes and forms of etched fiducial of the second embodiment of the present invention are contemplated. Any shape which may readily serve as a reference point is suitable. Additionally, various means may be used to form the through-holes, notches, and indicia of the present invention. Thus, these and other modifications and additions may be obvious to those skilled in the art and may be implemented to adapt the present invention for use in a variety of different applications.

What is claimed is:

1. A method for aligning an infrared detector array with an array of electrical connectors formed on a support surface, the infrared detector array having first and second sides, and a plurality of detector elements formed upon the first side thereof, the method comprising the steps of:
   (a) forming a plurality of indicia upon the second side of the infrared detector array, the indicia being disposed in predetermined positions in relation to the detector elements;
   (b) forming a corresponding plurality of reference indices upon the support surface proximate the array of electrical connectors such that the indices are disposed in predetermined positions in relation to the electrical connectors;
   (c) attaching the second side of the infrared detector array to a substrate, the substrate being transparent; and
   (d) positioning the first side of the detector array upon the support surface and aligning the indicia to the reference indices by observing the indicia through the transparent substrate wherein alignment of the indicia and reference indices results in alignment of the detector elements with the electrical connectors.

2. The method as recited in claim 1 wherein the step of forming a plurality of indicia comprises forming apertures through the detector array, the apertures extending from the first side of the array to the second side of the array.

3. The method as recited in claim 2 further comprising the step of defining the locations where apertures are to be formed by providing corresponding indicia on a detector pixel implant mask such that the locations are marked on the first side of the array during the pixel implant process.

4. The method as recited in claim 3 wherein the step of forming apertures through the detector array comprises etching apertures through the detector array at the locations marked on the first side of the array.

5. The method as recited in claim 4 wherein the step of etching apertures through the detector array further comprises using an etchant specific to the detector material such that the substrate is not etched.

6. The method as recited in claim 3 wherein the step of forming apertures comprises the step of forming apertures through the detector array with a laser, the apertures being formed at the locations marked on the first side.

7. The method as recited in claim 6 wherein the step of forming apertures through the detector array with a laser comprises forming apertures with a XeCl excimer laser.

8. The method as recited in claim 1 wherein the step of forming a plurality of indicia comprises etching the indicia upon the second side of the detector array.

9. The method as recited in claim 8 wherein the step of etching the indicia upon the second side comprises:
  (a) placing the detector array in a double side mask aligner;
  (b) aligning a mask for the second side of the detector array to a primary reference located on the first side of the detector array, said mask having the indicia formed thereon; and
  (c) exposing and developing the second side of the detector array to form the indicia thereon.

10. A method for aligning an infrared detector array with an array of electrical connectors formed on a support surface, the infrared detector array having first and second sides, and a plurality of detector elements formed upon the first side thereof, the method comprising the steps of:
  (a) defining the locations where apertures are to be formed by providing corresponding indicia on a detector pixel implant mask such that the locations are marked on the first side of the array during the pixel implant process;
  (b) forming apertures through the detector array with a laser, the apertures extending from the first side of the array to the second side of the array, the apertures being formed at locations marked on the first side of the detector array, the apertures being disposed in predetermined positions in relation to the detector elements;
  (c) forming a corresponding plurality of reference indices upon the support surface proximate the array of electrical connectors such that the indices are disposed in predetermined positions in relation to the electrical connectors;
  (d) attaching the second side of the infrared detector array to a substrate, the substrate being transparent; and
  (e) positioning the first side of the detector array in laminar juxtaposition to the support surface and aligning the indicia to the reference indices by observing the indicia through the transparent substrate wherein alignment of the indicia and reference indices results in alignment of the detector elements with the electrical connectors.

11. The method as recited in claim 10 wherein the step of forming apertures through the detector array with a laser comprises forming apertures with a XeCl excimer laser.

* * * * *